US011694907B2

(12) United States Patent
Fujino et al.

(10) Patent No.: US 11,694,907 B2
(45) Date of Patent: Jul. 4, 2023

(54) SUBSTRATE PROCESSING APPARATUS, RECORDING MEDIUM, AND FLUID CIRCULATION MECHANISM

(71) Applicant: HITACHI KOKUSAI ELECTRIC INC., Tokyo (JP)

(72) Inventors: Toshiki Fujino, Toyama (JP); Atsushi Umekawa, Toyama (JP); Takayuki Nakada, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 157 days.

(21) Appl. No.: 15/667,106

(22) Filed: Aug. 2, 2017

(65) Prior Publication Data

US 2018/0040488 A1 Feb. 8, 2018

(30) Foreign Application Priority Data

Aug. 4, 2016 (JP) .................................. 2016-153823
Jun. 14, 2017 (JP) .................................. 2017-116796

(51) Int. Cl.
*H01L 21/67* (2006.01)
*H01L 21/677* (2006.01)
(Continued)

(52) U.S. Cl.
CPC ...... *H01L 21/67017* (2013.01); *C23C 16/463* (2013.01); *C23C 16/466* (2013.01);
(Continued)

(58) Field of Classification Search
CPC ......... H01L 21/67017; H01L 21/67109; H01L 21/67196; H01L 21/67757;
(Continued)

(56) References Cited

U.S. PATENT DOCUMENTS 5,407,350 A * 4/1995 Iwabuchi ................ C23C 16/54
432/11
5,551,984 A * 9/1996 Tanahashi ........... C23C 16/4401
118/715
(Continued)

FOREIGN PATENT DOCUMENTS

JP 2002-176045 A 6/2002
JP 2003-282446 A 10/2003
(Continued)

OTHER PUBLICATIONS

Korean Office Action dated Dec. 13, 2018 for the Korean Patent Application No. 10-2017-0098106.
(Continued)

*Primary Examiner* — Jeffrie R Lund
(74) *Attorney, Agent, or Firm* — Volpe Koenig

(57) ABSTRACT

A substrate processing apparatus, includes a reaction furnace, a preparatory chamber provided below the reaction furnace, an elevating mechanism configured to raise/lower a substrate holder between the reaction furnace and the preparatory chamber, a fluid circulation mechanism including a suction part for sucking a fluid within the preparatory chamber, a pipe part constituting a flow path through which the fluid flows from the suction part to a supply part, and a cooling mechanism, provided in the flow path, for cooling the fluid, and a control part for controlling the fluid circulation mechanism and the elevating mechanism to circulate the fluid sucked from the suction part through the flow path, and supply the fluid from the supply part to the preparatory chamber. The cooling mechanism is disposed adjacent to the suction part to cool the fluid introduced from the suction part before circulating the fluid through the flow path.

17 Claims, 13 Drawing Sheets

(51) Int. Cl.
*C23C 16/46* (2006.01)
*C23C 16/458* (2006.01)

(52) U.S. Cl.
CPC .. *H01L 21/67109* (2013.01); *H01L 21/67196* (2013.01); *H01L 21/67757* (2013.01); *C23C 16/4582* (2013.01); *C23C 16/4583* (2013.01); *C23C 16/4584* (2013.01)

(58) Field of Classification Search
CPC ............ C23C 16/4583; C23C 16/4582; C23C 16/4584; C23C 16/463; C23C 16/466
USPC ......................................................... 118/724
See application file for complete search history.

(56) References Cited

U.S. PATENT DOCUMENTS

| | | | | |
|---|---|---|---|---|
| 2001/0010950 A1* | 8/2001 | Savage | ............... | C23C 16/54 438/124 |
| 2002/0023458 A1* | 2/2002 | Sakata | ............... | F27B 5/04 62/378 |
| 2010/0151695 A1* | 6/2010 | Masaki | ............... | H01L 21/67115 438/795 |
| 2010/0229416 A1* | 9/2010 | Aburatani | ......... | H01L 21/67757 34/194 |
| 2011/0239937 A1* | 10/2011 | Ahn | ................. | H01L 21/67201 118/696 |
| 2012/0083120 A1 | 4/2012 | Nakada et al. | | |
| 2012/0270170 A1 | 10/2012 | Nitadori | | |
| 2017/0218513 A1* | 8/2017 | Nakada | ............... | C23C 16/402 |
| 2017/0300044 A1* | 10/2017 | Asai | ............... | G05B 19/41875 |
| 2017/0352556 A1* | 12/2017 | Komae | ............... | H01L 21/677 |
| 2018/0024536 A1* | 1/2018 | Yoneda | ............ | G05B 19/4183 438/14 |
| 2018/0040488 A1* | 2/2018 | Fujino | ............... | H01L 21/67017 |
| 2021/0166945 A1* | 6/2021 | Hirochi | ............. | H01L 21/67766 |
| 2021/0254211 A1* | 8/2021 | Nakada | ............. | H01L 21/02271 |

FOREIGN PATENT DOCUMENTS

| | | |
|---|---|---|
| JP | 2007242789 A * | 9/2007 |
| JP | 2012-079907 A | 4/2012 |
| JP | 2012-169367 A | 9/2012 |
| JP | 2014-060327 A | 4/2014 |
| KR | 20110033482 A | 3/2011 |
| KR | 20110112074 A | 10/2011 |
| KR | 20120092057 A | 8/2012 |
| WO | 2006/103978 A1 | 10/2006 |

OTHER PUBLICATIONS

Japanese Office Action dated Feb. 5, 2020 for the Japanese Patent Application No. 2017-116796.

* cited by examiner

FIG. 5
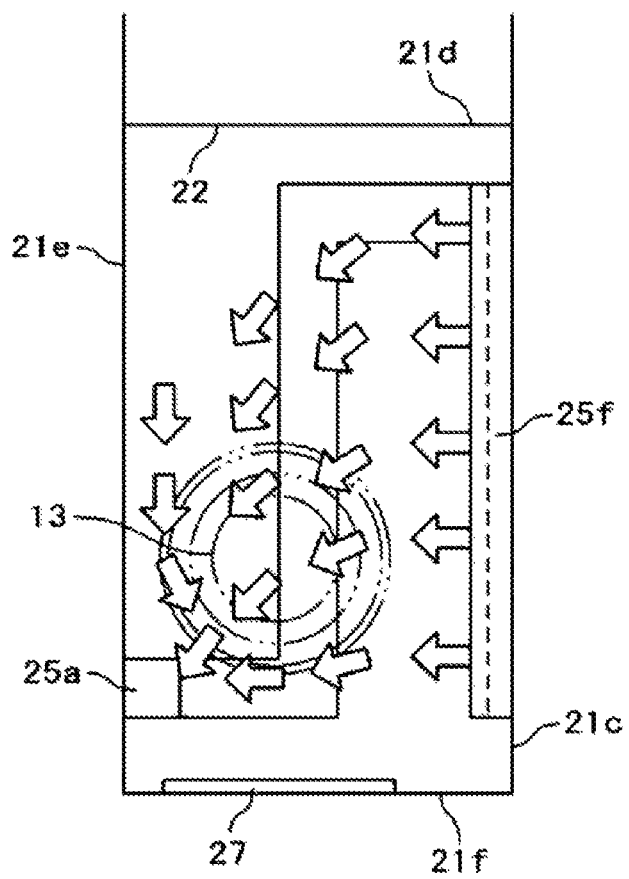
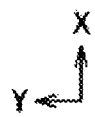

FIG. 12

| Item No. | Nearest radiator | Water cooled plate (3l/min) | Forced exhaust duct (m³/min) | Oxygen concentration in transfer chamber (ppm) | Highest temperature in transfer chamber (°C) | ⇒Time to reach 80 degrees C |
|---|---|---|---|---|---|---|
| 00 | — | — | — | 8 | 97.6 | 11'11" |
| 01 | — | Used | — | 8 | 92.3 | 10'35" |
| 02 | — | — | 10 | *19.8% | 108.7 | 5'34" |
| 03 | Used | — | — | 8 | 88.3 | 8'08" |
| 04 | Used | Used | — | 8 | 73.7 | 8'17" |

FIG. 13

| Item No. | Water cooled plate (3l/min) | Oxygen concentration in transfer chamber (ppm) | Highest temperature in transfer chamber (°C) | ⇒Time to reach 80 degrees C |
|---|---|---|---|---|
| 00 | — | 8 | 129.4 | 32'43" |
| 01 | Used | 8 | 116.7 | 29'54" |

SUBSTRATE PROCESSING APPARATUS, RECORDING MEDIUM, AND FLUID CIRCULATION MECHANISM

CROSS-REFERENCE TO RELATED APPLICATIONS

This application is based upon and claims the benefit of priority from Japanese Patent Application No. 2016-153823, filed on Aug. 4, 2016, and Japanese Patent Application No. 2017-116796, filed on Jun. 14, 2017, the entire contents of which are incorporated herein by reference.

TECHNICAL FIELD

The present disclosure relates to a substrate processing apparatus, a recoding medium, and a fluid circulation mechanism.

BACKGROUND

In general, a vertical substrate processing apparatus has been used in a manufacturing process of a semiconductor. The vertical substrate processing apparatus may perform, in a transfer chamber (preparatory chamber) disposed on a lower side of a process chamber for processing wafers, the charging of unprocessed wafers to a substrate holder (boat) to be loaded into the process chamber (wafer charging) and the discharging of the processed wafers from the substrate holder unloaded from the interior of the process chamber (wafer discharging). In the transfer chamber, the high-temperature processed wafer unloaded from the process chamber is cooled to a predetermined temperature. In a related art, a cooling wall is provided in a preparatory chamber so as to surround a boat, and a coolant is circulated inside the cooling wall so as to cool the wafers. In another related art, a cooling wall and a cooling gas supply part provided at a position facing the cooling wall across a boat are provided in a preparatory chamber, and a cooling gas is supplied from the cooling gas supply part to the boat so as to cool the wafers. In a further related art, a clean unit for blowing the clean air into a transfer chamber and an exhaust unit disposed at a position facing the clean unit are provided so as to cool the wafers with an air flow formed by the clean unit and the exhaust unit.

SUMMARY

Some embodiments of the present disclosure provide a technique capable of shortening the time required for cooling a transfer chamber and substrates held by a boat.

According to one embodiment of the present disclosure, there is provided a configuration which includes a reaction furnace into which a substrate holder holding a plurality of substrates is loaded and unloaded from, a preparatory chamber provided below the reaction furnace, the substrate holder being disposed at a predetermined position in the preparatory chamber, an elevating mechanism configured to raise and lower the substrate holder between the reaction furnace and the preparatory chamber, a fluid circulation mechanism including a suction part configured to suck a fluid within the preparatory chamber, a pipe part constituting a flow path through which the fluid flows from the suction part to a supply part, and a cooling mechanism provided in the flow path and configured to cool the fluid, and a control part configured to control the fluid circulation mechanism and the elevating mechanism so as to lower the substrate holder from the reaction furnace to the predetermined position in the preparatory chamber, circulate the fluid sucked from the suction part through the flow path, and supply the fluid from the supply part to the preparatory chamber. The cooling mechanism is disposed adjacent to the suction part to cool the fluid introduced from the suction part with the cooling mechanism before circulating the fluid through the flow path.

BRIEF DESCRIPTION OF DRAWINGS

FIG. 5 is a schematic plan view showing an air flow in the transfer chamber shown in FIG. 2.

FIG. 12 is a diagram for explaining the effect of the embodiment of the present disclosure.

FIG. 13 is a diagram for explaining the effect of the cooling wall of the embodiment of the present disclosure.

DETAILED DESCRIPTION

<Embodiments of the Present Disclosure>

Figure 1:
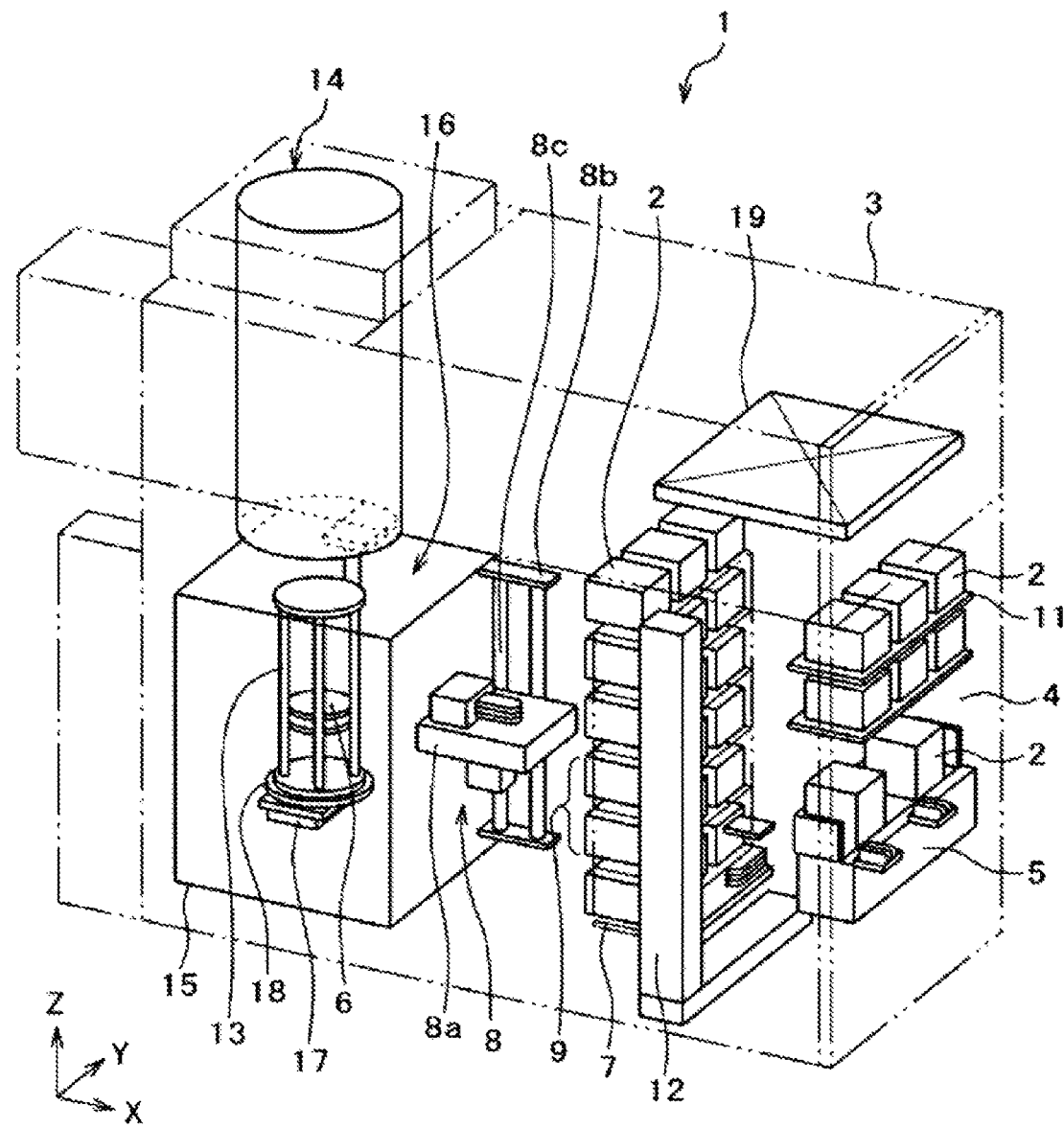
FIG. 1 is an oblique perspective view of a substrate processing apparatus used in an embodiment of the present disclosure.

Embodiments of the present disclosure will be now described in detail with reference to the drawings. Like or equivalent components, members, and processes illustrated in each drawing are given like reference numerals and a repeated description thereof will be properly omitted. Further, the embodiments are presented by way of example only, and are not intended to limit the present disclosure, and any feature or combination thereof described in the embodiments may not necessarily be essential to the present disclosure.

(1) Outline of Substrate Processing Apparatus

The substrate processing apparatus described in the present embodiment is used in a manufacturing process of a semiconductor device. The substrate processing apparatus processes substrates to be processed by heating the substrates with a heater in a state in which the substrates are accommodated in a process chamber. More specifically, the substrate processing apparatus is a vertical substrate processing apparatus that simultaneously processes a plurality of substrates stacked at predetermined intervals in the vertical direction.

Examples of the substrate to be processed by the substrate processing apparatus include a semiconductor wafer substrate (hereinafter simply referred to as "wafer") in which a semiconductor device is built. Furthermore, examples of the process performed by the substrate processing apparatus include an oxidation process, a diffusion process, a reflow or annealing process for carrier activation and planarization after ion implantation, a film forming process by a thermal CVD (Chemical Vapor Deposition) reaction, and the like.

(2) Schematic Configuration of Substrate Processing Apparatus

Next, a schematic configuration example of a substrate processing apparatus preferably used in an embodiment of the present disclosure will be described.

(Apparatus as a Whole)

In the substrate processing apparatus 1, the wafers 6 are accommodated in a cassette 2 as a substrate storage container and are loaded into or unloaded from the substrate processing apparatus 1. The substrate processing apparatus 1 includes a housing 3. On the front wall of the housing 3, a cassette loading/unloading port 4 is provided so as to be opened and closed by a front shutter (not shown). Inside the housing 3, a cassette stage 5 is provided adjacent to the cassette loading/unloading port 4.

The cassette 2 is loaded onto the cassette stage 5 by an in-process transfer device (not shown) and is unloaded from the cassette stage 5. The cassette stage 5 is arranged such that the wafers 6 in the cassette 2 are kept in a vertical posture by the in-process transfer device and the wafer gateway of the cassette 2 is oriented upward (in the + direction of the Z axis). The cassette stage 5 may be rotated so that the wafer gateway of the cassette 2 faces the rear side of the housing 3.

Cassette shelves 7 are installed substantially at the center of the housing 3 in the front-rear direction (X-axis direction). The cassette shelves 7 are arranged in a plurality of stages and in a plurality of rows so that each of the cassette shelves 7 stores a plurality of cassettes 2. The cassette shelves 7 are provided with a transfer shelf 9 which accommodates the cassette 2 to be transferred by a wafer transfer device 8. A spare cassette shelf 11 is provided above the cassette stage 5 and is configured to preliminarily store the cassette 2.

Between the cassette stage 5 and the cassette shelves 7, a cassette transfer device 12 is installed. The cassette transfer device 12 is configured to transfer the cassette 2 between the cassette stage 5, the cassette shelves 7 and the spare cassette shelf 11.

A wafer transfer device 8 is installed on the rear side of the cassette shelves 7 (on the −direction side of the X axis). The wafer transfer device 8 includes a wafer transfer mechanism 8a capable of horizontally rotating or linearly moving the wafer 6, an elevating mechanism 8b for moving the wafer transfer mechanism 8a up and down, and a tweezers 8c provided on the wafer transfer mechanism 8a and configured to pick up the wafer 6.

On the rear side of the wafer transfer device 8, a process furnace 14 as a reaction furnace for thermally treating the wafers 6 and a transfer chamber 15 as a preparatory chamber for temporarily accommodating the wafers 6 before and after the heat treatment are provided adjacent to each other in the vertical direction. In the transfer chamber 15, a boat elevating (elevating mechanism) 16 is provided for raising and lowering a boat (substrate holder) 13 with respect to the process furnace 14. The boat 13 is provided with a plurality of holding members and is configured to horizontally hold a plurality of wafers 6 (for example, about 50 to 150 wafers) aligned in the vertical direction with their centers aligned with each other.

The elevating mechanism 16 includes an elevating arm 17. A seal cap 18 as a lid is horizontally provided on the elevating arm 17. The seal cap 18 vertically supports the boat 13. The seal cap 18 is configured to open and close the furnace opening portion of the process furnace 14.

Above the cassette shelves 7, a clean unit 19 is provided for supplying a clean air as a cleaned atmosphere. The clean unit 19 is configured to circulate the clean air inside the housing 3.

(Transfer Chamber)

As shown in FIGS. 2 to 5, the substrate processing apparatus 1 includes a transfer chamber 15 in which a charging operation for causing unprocessed wafers 6 to be held in the boat 13 and a discharging operation for taking out processed wafers 6 from the boat 13 are performed. The transfer chamber 15 is formed in a quadrangular shape in a plan view by a ceiling wall 21a, a floor 21b, and side walls 21c, 21d, 21e and 21f surrounding four sides of the transfer chamber 15. However, the shape of the transfer chamber 15 is not necessarily limited to the quadrangular shape in a plan view but may be a polygonal shape in a plan view (for example, a triangle shape in a plan view, a pentagonal shape in a plan view, or the like). Inside the ceiling wall 21a, the floor 21b and the side walls 21c, 21d, 21e and 21f, at least one reflection panel (transfer chamber panel), which are not shown, is provided.

In the side wall 21d on the front side (the + direction side of the X axis) of the transfer chamber 15, a wafer loading/unloading port 22 as a substrate-container-side communication port is provided in order to transfer the wafers 6 between the wafer transfer device 8 and the boat 13 in the transfer chamber 15. An opening 23 communicating with the interior of the process chamber 42 of the process furnace 14 is provided on the ceiling wall 21a of the transfer chamber 15 in such a shape and size that allows the boat 13 holding the wafers 6 to pass therethrough. A transfer chamber door (not shown) is provided in the side wall 21f on the rear side (the − direction side of the X axis) of the transfer chamber 15.

In the transfer chamber 15, a fluid circulation mechanism 25 and a cooling wall (cooling part) 27 are disposed in addition to the boat 13 and the elevating mechanism 16 for raising and lowering the boat 13. The boat 13 is disposed closer to the side wall 21f on the more rear side than the center of the transfer chamber 15 and closer to the side wall 21e on the right side as viewed from the front side. The fluid circulation mechanism 25 sucks (e.g., removes), cools and cleans an atmosphere (air) as a fluid existing in the transfer chamber 15, and supplies the same into the transfer chamber 15.

(Fluid Circulation Mechanism)

The fluid circulation mechanism 25 includes a first duct 25a extending from the upper side to the lower side along the Z-axis direction, a second duct 25b extending on the floor along the Y-axis direction, a third duct 25c extending on the floor along the X-axis direction, and a fourth duct 25d extending on the floor along the Y axis direction. Each of the first duct 25a, the second duct 25b, the third duct 25c and the fourth duct 25d has a rectangular cross section. The first duct 25a is provided on the rear side (the − direction side of the X axis) of the transfer chamber 15. For example, the first duct 25a is provided with a suction part 25g as a suction port at the uppermost part (upper end part) of the boat 13 (or the transfer chamber 15) and is configured to locally suck a high-temperature fluid in the transfer chamber 15. Further, a suction part 25h as a suction port is arranged in the vicinity of the central portion (a middle portion in a vertical direction) of the boat 13 to prepare for the heat to release (or leak, flow, exchange) from the wafers 6. The suction parts 25g and 25h are disposed in the vicinity of the wafers 6 mounted in the central portion) of the boat 13. That is, by disposing the suction part 25h in a region where the heat releases from the processed wafers 6 is unlikely to occur, it is possible to reduce the temperature similarly to the wafers 6 mounted on the lower end portion of the boat 13. As described above, in order to efficiently reduce the temperatures of the transfer chamber 15 and the wafers 6, the suction parts 25g and 25h are disposed in a region of the transfer chamber 15 where the temperature becomes higher after boat loading or a region where the heat release from the wafer 6 is difficult to occur. The first duct 25a includes heat exchangers 25i and 25j as cooling mechanisms which are disposed adjacent to the downstream side of the suction parts 25g and 25h of the first duct 25a so as to immediately cool a gas as a kind of fluid entered from the suction parts 25g and 25h. The first duct 25a is disposed in the vicinity of the side wall 21e. The heat exchangers 25i and 25j are provided with pipes through which a coolant passes. As a high-temperature gas (for example, a high-temperature fluid introduced from the suction parts 25g and 25h) passes around the heat exchangers 25i and 25j, the heat is transferred from the gas to the coolant. The heat is dissipated as the coolant (medium) is discharged to the outside of the transfer chamber 15 (substrate processing apparatus 1). By disposing the suction part 25g in the upper portion of the transfer chamber 15 and disposing the suction part 25h at a location such as the central portion of the wafer mounting region on the boat 13, and by locally sucking the atmosphere from the suction parts 25g and 25h, it is possible to quickly and efficiently send the high-temperature gas into the heat exchangers 25i and 25j. The fourth duct 25d includes a circulation fan 25k installed therein. As described above, in the present embodiment, the fluid circulation mechanism 25 can efficiently cool the high-temperature gas because the suction parts 25g and 25h and the heat exchangers 25i and 25j are provided adjacent to each other. Furthermore, the fluid circulation mechanism 25 can cool the fluid introduced from the suction parts 25g and 25h by the heat exchangers 25i and 25j before circulating the fluid through the flow path. Since the fluid cooled by passing through the heat exchangers 25i and 25j circulates through the flow path, it is not possible for the fluid to hinder the temperature reduction of the atmosphere of the transfer chamber 15 due to the heat radiation.

The fluid circulation mechanism 25 further includes a fifth duct 25e connected to the fourth duct 25d and provided with a heat exchanger 251 as a cooling mechanism, and a sixth duct 25f connected to the fifth duct 25e and provided with a filter 25m. The fifth duct 25e is disposed along the left side wall 21c as viewed from the front side in the transfer chamber 15. The fifth duct 25e has a rectangular parallelepiped shape in which the side surface facing the side wall 21c is larger than the bottom surface, the top surface, the rear side surface and the front side surface. The heat exchanger 251 is provided with a pipe through which a coolant passes.

Similar to the heat exchangers 25i and 25j, the high-temperature gas (for example, the fluid introduced from the suction parts 25g and 25h and passed through the heat exchangers 25i and 25j) passes around the heat exchanger 251. Thus, the heat is transferred from the gas to the coolant. The heat is dissipated as the coolant (medium) is discharged to the outside of the transfer chamber 15 (substrate processing apparatus 1). In this way, the fluid introduced from the suction parts 25g and 25h passes through the heat exchangers twice, whereby the more cooled fluid is circulated. The sixth duct 25f is disposed above the fifth duct 25e along the side wall 21c and is formed in a rectangular parallelepiped shape just like the fifth duct 25e. The sixth duct 25f serving as a supply part includes a blowout port 25n for supplying a clean air passed through the filter 25m and functions as a clean unit for blowing out the clean air into the transfer chamber 15. The first duct 25a, the second duct 25b, the third duct 25c, the fourth duct 25d, the fifth duct 25e and the sixth duct 25f are provided as pipe parts which constitute a flow path through which the fluid existing between the suction parts 25g and 25h and the sixth duct 25f flows. As used herein, the term "circulation duct" is a generic name of the first duct 25a, the second duct 25b, the third duct 25c, the fourth duct 25d, the fifth duct 25e and the sixth duct 25f.

Figure 4:
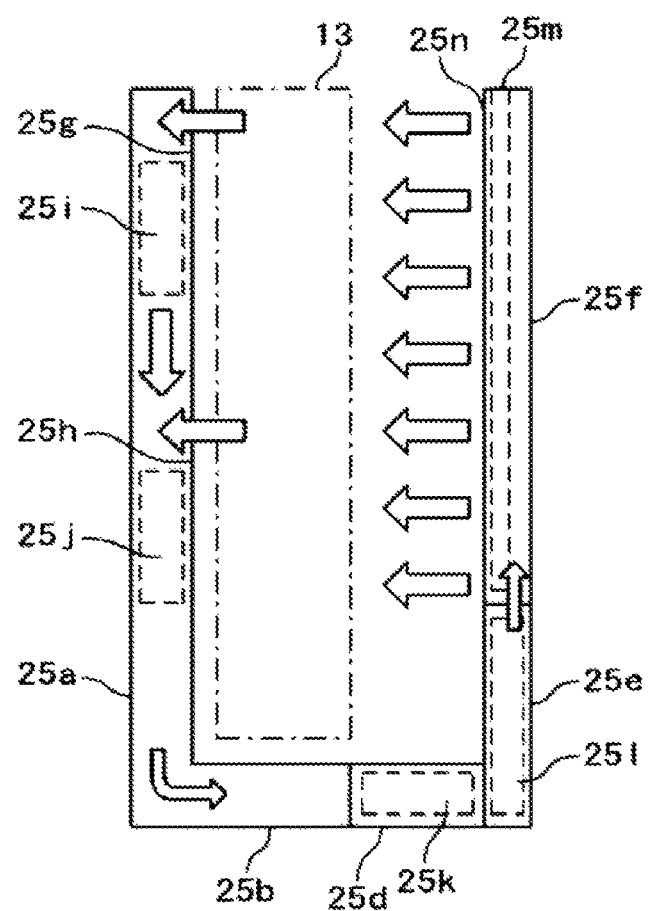
FIG. 4 is a schematic side view showing the fluid circulation mechanism shown in FIG. 2.

As shown in FIGS. 4 and 5, the air exhausted from the sixth duct 25f in the Y-axis direction passes between and around a plurality of wafers 6 mounted on the boat 13 and is sucked into the suction parts 25g and 25h.

In the present embodiment, the transfer chamber 15 is not provided with a special air supply duct for supplying a cooling gas from the outside. The transfer chamber 15 is not cooled by the supply air (blow) using the air suction duct. The transfer chamber 15 is cooled by the suction of a high-temperature fluid. Accordingly, it is possible to suppress the swirling-up of the particles and the temperature bias (a state in which only a specific portion is not cooled and is heated to a high temperature) in the transfer chamber 15.

Figure 3:
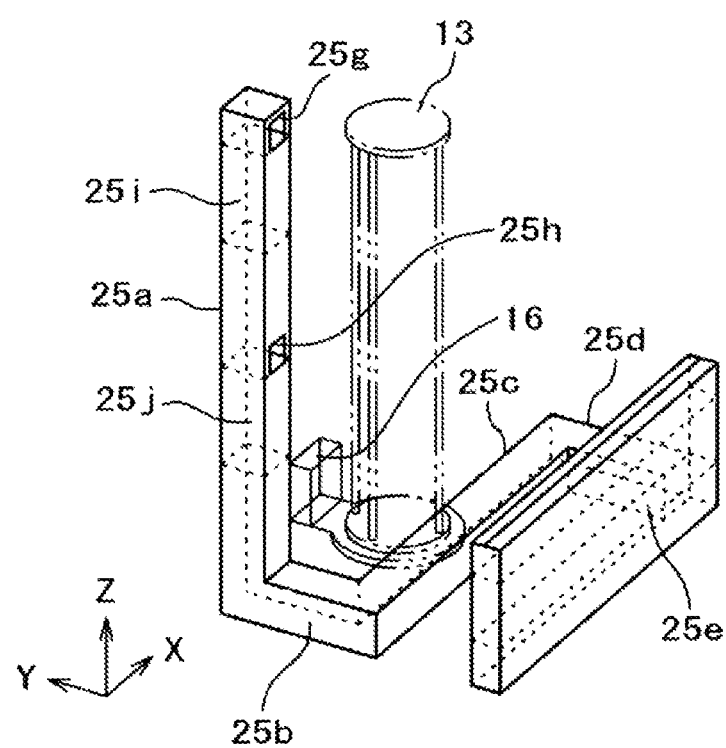
FIG. 3 is a schematic perspective view showing a fluid circulation mechanism of the transfer chamber shown in FIG. 2.

In order to isolate the transfer chamber 15 from the outside, most of the atmosphere of the transfer chamber 15 circulates through the transfer chamber 15 via the fluid circulation mechanism 25. Therefore, in order to maintain the temperature of the transfer chamber 15, it is necessary to install a heat exchanger having a sufficient heat dissipation capability. Thus, in order to efficiently perform the heat exchange, as shown in FIGS. 3 and 4, the heat exchangers 25i and 25j are installed adjacent to the suction parts 25g and 25h of the first duct 25a on the downstream side of the suction parts 25g and 25h so as to immediately cool the fluid sucked by the suction parts 25g and 25h, thereby reducing the heat which is accumulated in the apparatus from the surrounding members when the fluid passes through the circulation duct after the first duct 25a. This eliminates the need for a heat exchanger of a very large size in the fifth duct 25e. It is therefore possible to reduce the size of the heat exchanger 251. Moreover, it is also possible not to include the heat exchanger 251.

(Cooling Wall)

Figure 6A:
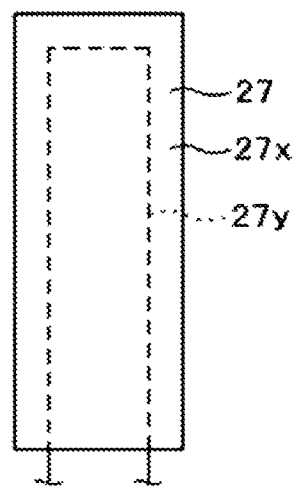
FIG. 6A is a schematic view for explaining a structure of a cooling wall used in an embodiment of the present disclosure.
Figure 6B:
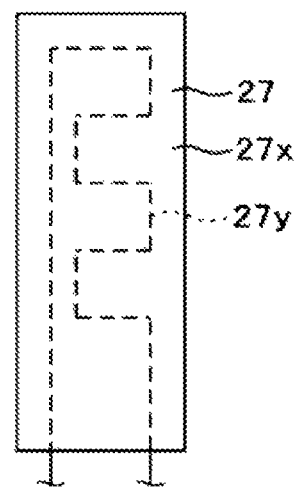
FIG. 6B is a schematic view for explaining a structure of a cooling wall used in an embodiment of the present disclosure

The cooling wall 27 is mainly used for the purpose of absorbing the radiant heat from the process chamber 42 (the interior of the process furnace 14). The cooling wall 27 is provided close to the side wall 21f on the rear side of the apparatus in the transfer chamber 15. As shown in FIGS. 6A and 6B, the cooling wall 27 is formed of a metal plate 27x made of a material having good heat conductivity, for example, aluminum. A flow path 27y through which a coolant (for example, water) flows is arranged in the metal plate 27x. When the boat 13 is raised and lowered, the temperature rise of the transfer chamber panel due to the radiant heat from the interior of the process furnace 14 is reduced by installing the cooling wall 27. This makes it possible to reduce the heat accumulated in the transfer chamber 15. It is preferable that the surface of the metal plate 27x is made to have a surface color (for example, a black color) with a good heat absorption property by processing the surface of the metal plate 27x with black alumite or the like. By processing the surface of the cooling wall 27 with black alumite or the like, it is possible to improve the absorption efficiency of the radiant heat by the cooling wall 27. This makes it possible to further improve the effect of shortening the cooling time of the wafers 6 and preventing the temperature rise inside the transfer chamber 15.

In the present embodiment, by combining the fluid circulation mechanism 25 and the cooling wall 27, it is possible to greatly reduce the temperature rise inside the transfer chamber 15 and to promote the heat dissipation from the wafers 6.

Since the film formation time will be shortened and more strict control of an oxide film will be is required in the future, it is necessary to eliminate the heat accumulated in the apparatus a much as possible.

(Controller)

Figure 7:
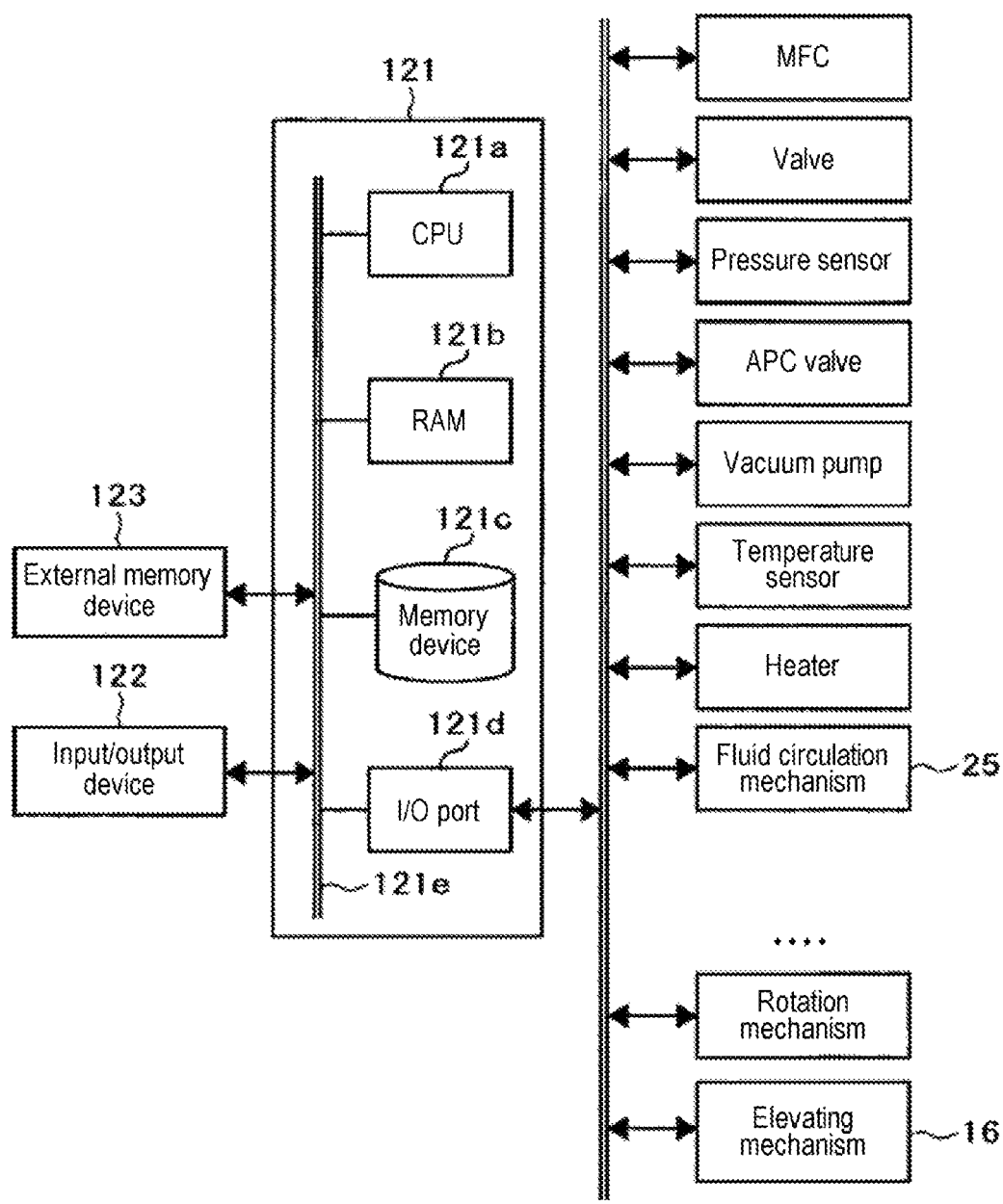
FIG. 7 is a block diagram showing a schematic configuration of a controller of a substrate processing apparatus used in an embodiment of the present disclosure.

As shown in FIG. 7, the controller 121 as the control part (control means) is configured as a computer including a CPU (Central Processing Unit) 121a, a RAM (Random Access Memory) 121b, a memory device 121c and an I/O port 121d. The RAM 121b, the memory device 121c and the I/O port 121d are configured to exchange data with the CPU 121a via an internal bus 121e. An input/output device 122 configured as, for example, a touch panel or the like is connected to the controller 121.

The memory device 121c is composed of, for example, a flash memory, an HDD (Hard Disk Drive), or the like. A control program for controlling the operations of a substrate processing apparatus, a process recipe in which sequences and conditions of a substrate processing process such as a thin film forming process or the like to be described later are written, or the like is readably stored in the memory device 121c. The process recipe functions as a program for causing the controller 121 to execute each sequence in a substrate processing process such as a thin film forming process or the like to be described later, so as to obtain a predetermined result. Hereinafter, the process recipe and the control program will be generally and simply referred to as "program." When the term "program" is used herein, it may indicate a case of including only the process recipe, a case of including only the control program, or a case of including both the process recipe and the control program. The RAM 121b is configured as a memory area (work area) in which a program or data read by the CPU 121a is temporarily stored.

The I/O port 121d is connected to the MFC valve pressure sensor, the APC valve, the vacuum pump, the temperature sensor, the heater, the rotation mechanism, the elevating mechanism 16, the fluid circulation mechanism 25, and the like.

The CPU 121a reads the control program from the memory device 121c and executes the control program. The CPU 121a is configured to read the process recipe from the memory device 121c in response to the input of an operation command from the input/output device 122 or the like. The CPU 121a is configured to control, according to the contents of the process recipe thus read, the flow rate adjustment operation of various gases by the MFC, the opening/closing operation of the valves, the opening/closing operation of the APC valve, the pressure regulating operation by the APC valve based on the pressure sensor, the start and stop of the vacuum pump, the temperature adjustment operation of the heater based on the temperature sensor, the rotation and rotational speed adjustment operation of the boat 13 by the rotation mechanism, the elevating operation of the boat 13 by the elevating mechanism 16, and the like. Furthermore, according to the present embodiment, the CPU 121a is configured to control the fluid circulation mechanism 25 so that after the boat 13 is lowered from the process furnace 14 to a predetermined position, the fluid in the transfer chamber 15 is sucked and delivered to the flow path from the suction parts 25g and 25h disposed in the vicinity of the boat 13, the fluid is cooled by the heat exchangers 25i and 25j provided in the vicinity of the suction parts 25g and 25h, and the cooled fluid is allow to flow through the flow path and is discharged from the sixth duct 25f to the transfer chamber 15. The control of the cooling of the processed wafers 6 (or the adjustment of the temperature in the transfer chamber 15) is configured so as to be incorporated in the process recipe, but is not limited to the form incorporated in the process recipe.

The controller 121 is not limited to being configured as a dedicated computer but may be configured as a general-purpose computer. For example, the controller 121 according to the present disclosure may be configured by preparing an external memory device (for example, a magnetic tape, a magnetic disk such as a flexible disk or a hard disk, an optical disk such as a CD or a DVD, a magneto-optical disk such as an MO, or a semiconductor memory such as a USB memory or a memory card) 123, which stores the aforementioned program, and installing the program in a general-purpose computer using the external memory device 123. Furthermore, the program may be supplied using a communication means such as the Internet or a dedicated line, instead of using the external memory device 123. The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123.

(3) Substrate Processing Process

Next, a sequence example of a process of forming a film on a substrate (hereinafter also referred to as a film forming process) will be described as one of manufacturing processes of a semiconductor device using the substrate processing apparatus described above. Description will be made herein on an example in which a film is formed on the wafer 6 by alternately supplying a first process gas (precursor gas) and a second process gas (reaction gas) to the wafer 6 as a substrate.

Hereinafter, description will be made an example in which a silicon nitride film ($Si_3N_4$ film) (hereinafter also referred to as SiN film) is formed on a substrate using a hexachlorodisilane ($Si_2Cl_6$, abbreviation: HCDS) gas as a precursor gas and using an ammonia ($NH_3$) gas as a reaction gas. In the following description, the operations of the respective parts constituting the substrate processing apparatus are controlled by the controller 121.

In the film forming process of the present embodiment, a SiN film is formed on the wafer 6 by performing, a predetermined number of times (once or more), a cycle which non-simultaneously performs a step of supplying a HCDS gas to the wafer 6 in the process chamber 42, a step of removing the HCDS gas (residual gas) from the process chamber, a step of supplying an NH$_3$ gas to the wafer 6 in the process chamber 42, and a step of removing the NH$_3$ gas (residual gas) from the process chamber 42.

The term "substrate" used herein is synonymous with the term "wafer."

(Wafer Supply Step)

When processing the wafer 6 with the substrate processing apparatus 1, first, the cassette 2 containing a plurality of wafers 6 is mounted on the cassette stage 5. Then, the cassette 2 is transferred from the cassette stage 5 onto the cassette shelf 7 by the cassette transfer device 12.

(Pre-Loading Transfer Step)

The wafer transfer mechanism 8a of the wafer transfer device 8 takes out the wafer 6 from the cassette 2. Then, the unprocessed wafer 6 taken out from the cassette 2 is transferred to the boat 13 located in the transfer chamber 15. That is, the wafer transfer device 8 performs a wafer charging operation of charging the unprocessed wafer 6 onto the boat 13 before the boat 13 is loaded into the process furnace 14. As a result, the boat 13 holds the plurality of wafers 6 in a stacked state in which the wafers 6 are spaced apart from each other in the vertical direction. The number of wafers 6 held by the boat 13 and batch-processed is, for example, 25 to 100. This makes it possible to enhance the mass productivity.

(Loading Step)

After the wafer charging operation, the boat 13 holding a plurality of wafers 6 in an unprocessed state is loaded into the process furnace 14 by the elevating operation of the elevating mechanism 16 (boat loading). In other words, by operating the elevating mechanism 16, the boat 13 holding the wafers 6 in an unprocessed state is loaded from the interior of the transfer chamber 15 into the process furnace 14. At this time, the temperature rise of the transfer chamber panel due to the radiant heat from the interior of the process furnace 14 can be suppressed by the cooling wall 27. This makes it possible to maintain the internal temperature of the transfer chamber 15 and to shorten the recovery time.

(Pressure Regulation and Temperature Adjustment)

Vacuum exhaust (reduced pressure exhaust) is performed so that the interior of the process furnace 14, i.e., the space where the wafers 6 exists (hereinafter also referred to as process chamber) has a predetermined pressure (degree of vacuum).

In addition, the wafers 6 in the process chamber 42 are heated by the heater so that the wafers 6 have a predetermined temperature. At this time, the degree of power supply to the heater is feedback-controlled based on the temperature information detected by the temperature sensor so that the process chamber has a predetermined temperature distribution. The heating of the process chamber 42 by the heater is continued at least until the processing on the wafers 6 is completed.

Further, the rotation of the boat 13 and the wafers 6 by the rotation mechanism is started. As the boat 13 is rotated by the rotation mechanism, the wafers 6 are rotated. The rotation of the boat 13 and the wafers 6 by the rotation mechanism is continued at least until the processing on the wafers 6 is completed.

(Film Forming Process)

If the temperature of the process chamber is stabilized at a preset processing temperature, the following two steps, i.e., steps 1 and 2 are sequentially executed.

[Step 1]

In this step, an HCDS gas is supplied to the wafers 6 in the process chamber.

By supplying the HCDS gas to the wafers 6, a silicon (Si)-containing layer as a first layer is formed on the outermost surface of the wafer 6.

After the first layer is formed, the supply of the HCDS gas is stopped. At this time, the process chamber 42 is vacuum-exhausted by the vacuum pump so that the HCDS gas unreacted or contributed to the formation of the first layer, which remains in the process chamber 42, is discharged from the process chamber 42. At this time, the supply of an N$_2$ gas to the process chamber 42 is maintained. The N$_2$ gas acts as a purge gas, whereby the effect of discharging the gas remaining in the process chamber 42 from the process chamber 42 can be enhanced.

[Step 2]

After step 1 is finished, the NH$_3$ gas supplied to the wafer 6 reacts with at least a part of the first layer, i.e., the Si-containing layer formed on the wafer 6 in step 1. Thus, the first layer is thermally nitrided in a non-plasma manner and is changed (modified) to a second layer containing Si and N, i.e., a silicon nitride layer (SiN layer). After the second layer is formed, the supply of the NH$_3$ gas is stopped. Then, by the same processing procedure as in step 1, the NH$_3$ gas unreacted or contributed to the formation of the second layer and the reaction by-products, which remain in the process chamber, are discharged from the interior of the process chamber.

(Performing a Predetermined Number of Times)

A SiN film having a predetermined composition and a predetermined film thickness can be formed on the wafer 6 by performing, a predetermined number of times (n times), the cycle which non-simultaneously, i.e., asynchronously performs the two steps described above. Incidentally, it is preferable that the cycle described above is repeated a plurality of times. That is, it is preferable that the thickness of the second layer (SiN layer) formed when performing the above-described cycle once is set to be smaller than a predetermined film thickness, and the above-described cycle is repeated a plurality of times until the thickness of the SiN film formed by laminating the second layer (SiN layer) reaches a predetermined film thickness.

(Purging and Atmospheric Pressure Restoration)

After the film forming process is completed, the heating by the heater is stopped, and the temperature of the wafer 6 in the processed state is lowered to a predetermined temperature. Then, once the preset time elapses, an N$_2$ gas is supplied into the process chamber 42 and is exhausted from the exhaust pipe. The N$_2$ gas acts as a purge gas. As a result, the interior of the process chamber 42 is purged, and the gas and reaction by-products remaining in the process chamber 42 are removed from the process chamber 42 (purging). Thereafter, the atmosphere in the process chamber 42 is replaced with an inert gas (inert gas replacement), and the pressure in the process chamber 42 is restored to the atmospheric pressure (atmospheric pressure restoration).

(Unloading Process)

Thereafter, by the elevating operation of the elevating mechanism 16, the seal cap 18 is lowered to open the lower end of the manifold, and the boat 13 holding the wafers 6 in the processed state is unloaded from the lower end of the manifold to the outside of the process chamber 42 (boat unloading). That is, the boat 13 holding the wafers 6 in the processed state is transferred from the process chamber 42 into the transfer chamber 15 by operating the elevating mechanism 16. While the elevating mechanism 16 is moved down, the interior of the process chamber 42 and the transfer chamber 15 are not shielded. Therefore, the temperature rise of the panel of the transfer chamber 15 is suppressed by the cooling wall 27, and the convection heat released from the boat 13 and the wafers 6 is efficiently dissipated to the outside of the apparatus by the heat exchangers 25i and 25j disposed in the vicinity of the suction parts 25g and 25h of the fluid circulation mechanism 25. As a result, an unexpected uneven temperature distribution disappears and the highest temperature region in the transfer chamber 15 lies in the vicinity of the suction parts 25g and 25h. Thus, by keeping the control member away from the suction parts 25g and 25h or by keeping the suction parts 25g and 25h away from the control member, it is possible to prevent the control member from being broken by heat.

Then, the boat 13 is allowed to wait at a predetermined position (a home position to be described later) until all the wafers 6 supported by the boat 13 are cooled down. In addition, while the boat 13 is being unloaded from the process chamber 42 by the elevating mechanism 16, the valve (opening/closing valve) of the gas supply pipe may be opened to supply an $N_2$ gas (inert gas).

(Post-Loading Transfer Step)

After the wafers 6 of the boat 13 on standby are cooled down to a predetermined temperature (for example, a room temperature or so), the wafer transfer device 8 discharges the wafers 6 from the boat 13. Then, the processed wafers 6 discharged from the boat 13 are transferred to and accommodated in the empty cassette 2 mounted on the cassette shelf 7. That is, the wafer transfer device 8 performs a wafer discharging operation of taking out the processed wafers 6 held by the boat 13 from the boat 13 and transferring the processed wafers 6 to the cassette 2.

Thereafter, the cassette 2 accommodating the processed wafers 6 is transferred from the cassette shelf 7 onto the cassette stage 5 by the cassette transfer device 12.

In this way, a series of substrate processing processes performed by the substrate processing apparatus 1 according to the present embodiment are completed.

<Other Embodiments of the Present Disclosure>

Even if the shape of the fluid circulation mechanism is deformed, the same effect can be obtained by installing the heat exchangers near the suction ports. Even if the installation location or the shape of the cooling wall is changed, the same effect can be obtained.

Figure 2:
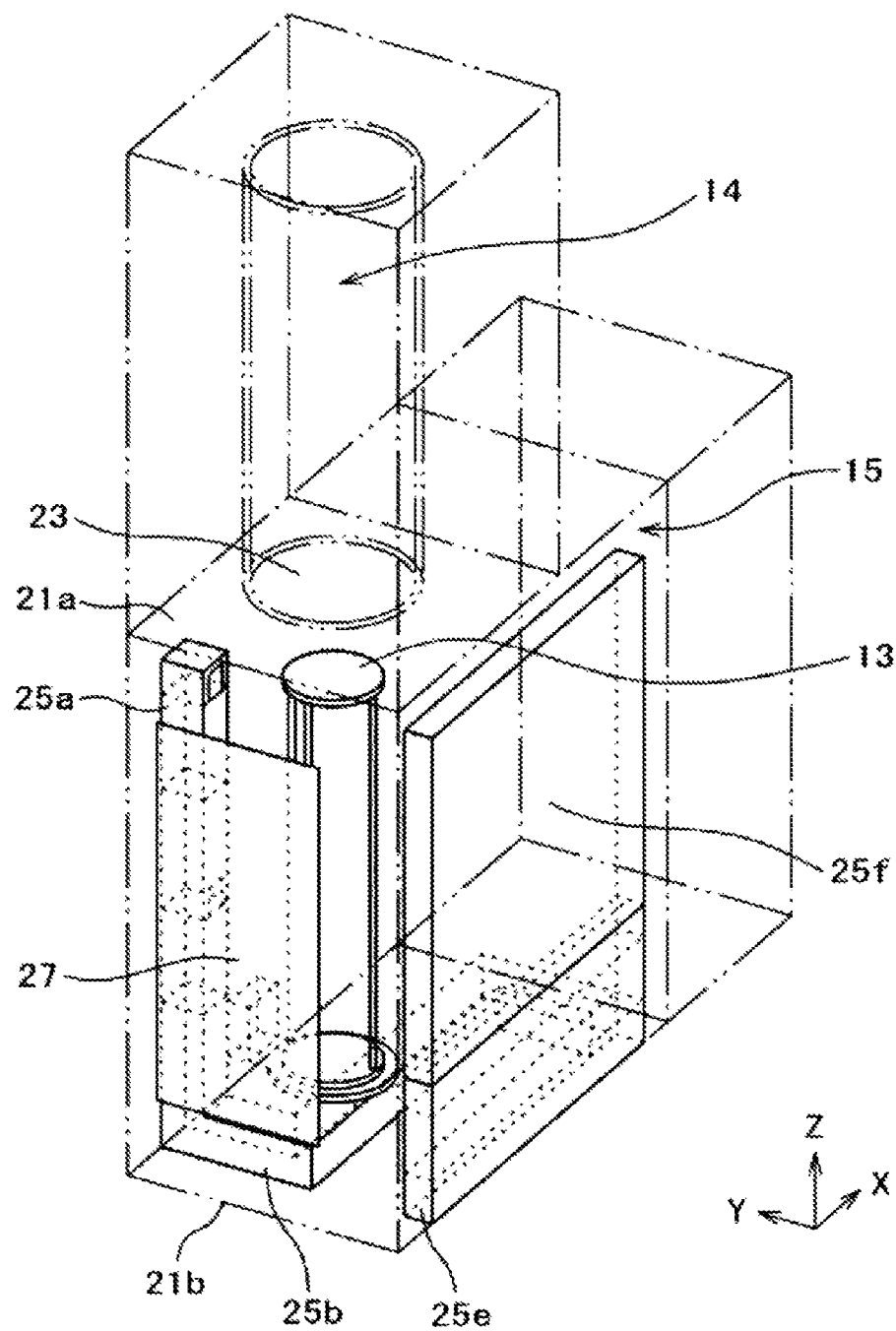
FIG. 2 is a schematic oblique perspective view of the interior of a substrate processing apparatus used in an embodiment of the present disclosure.
Figure 8:
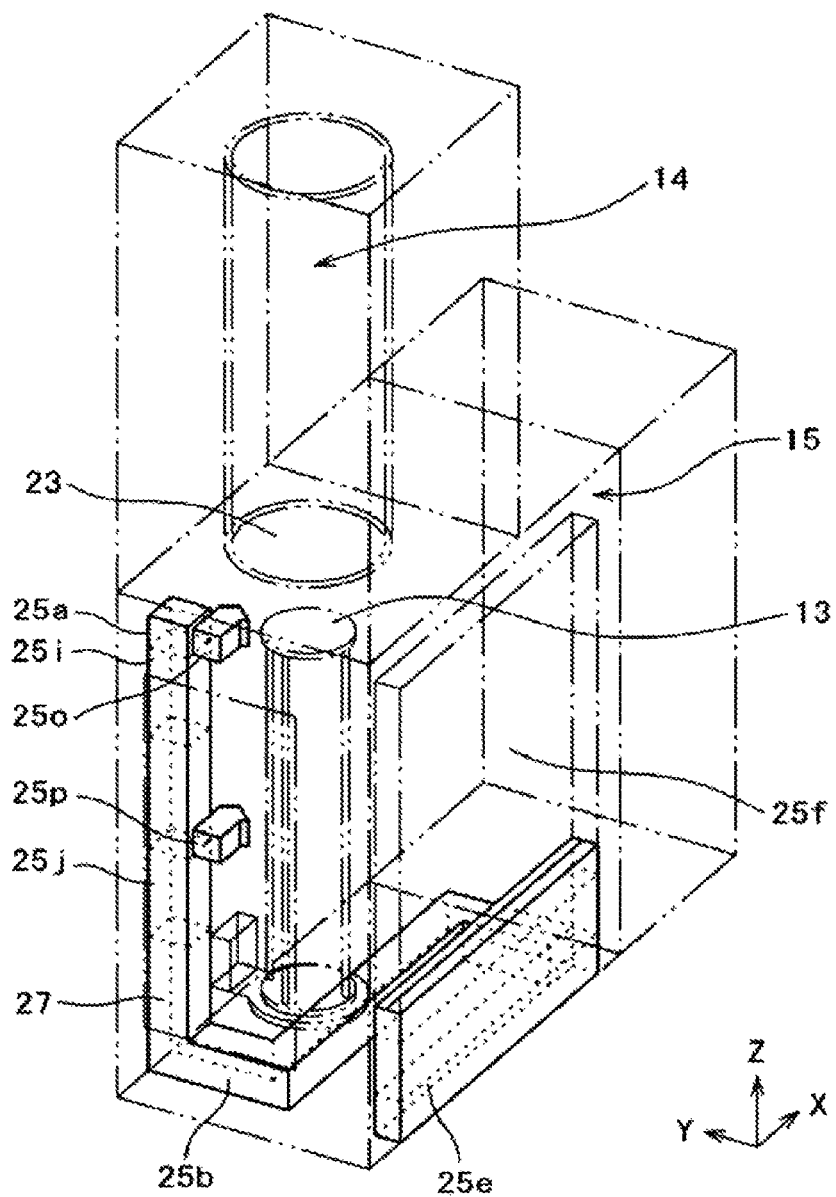
FIG. 8 is a schematic oblique perspective view of a substrate processing apparatus used in another embodiment of the present disclosure.
Figure 9:
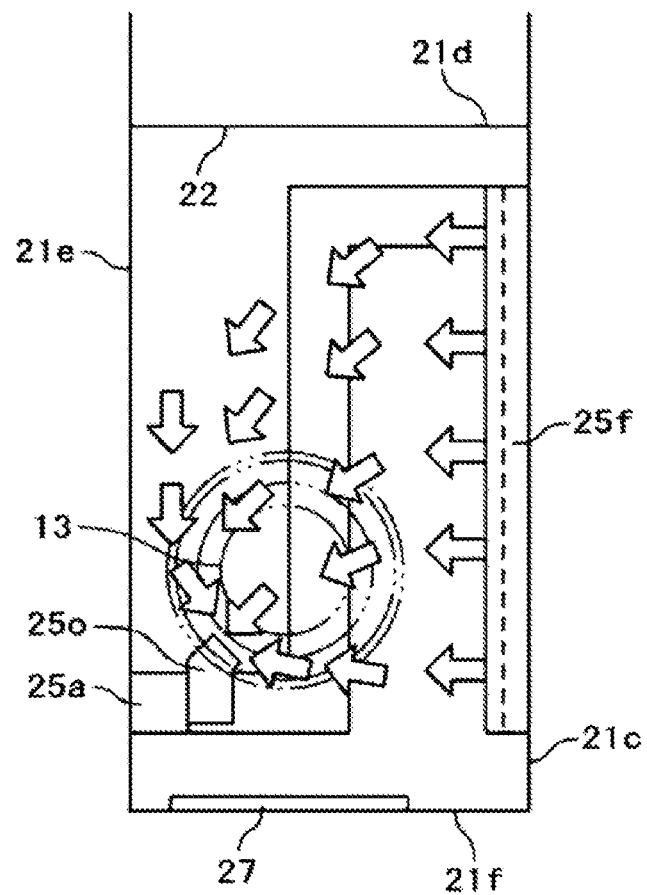
FIG. 9 is a schematic plan view showing an air flow in the transfer chamber shown in FIG. 8.

The substrate processing apparatus shown in FIG. 8 is the same as the substrate processing apparatus shown in FIG. 2, except for ducts 25o and 25p as take-in parts. As shown in FIG. 8, by attaching additional ducts 25o and 25p to the suction parts 25g and 25h and bringing take-in ports of the additional ducts 25o and 25p closer to the wafers 6, it is possible to further promote the heat dissipation from the wafers 6 and to further improve the heat exchange efficiency. As shown in FIG. 9, the air flow is almost the same as in FIG. 5. There is almost no influence on the air flow. In the fluid circulation mechanism 25 shown in FIGS. 8 and 9, by bringing a take-in port close to the wafers 6, it is possible to suck a gas having a higher temperature. By disposing the heat exchangers 25i and 25j immediately in the vicinity of the suction parts 25g and 25h, it is possible to further improve the heat exchange efficiency.

Figure 10:
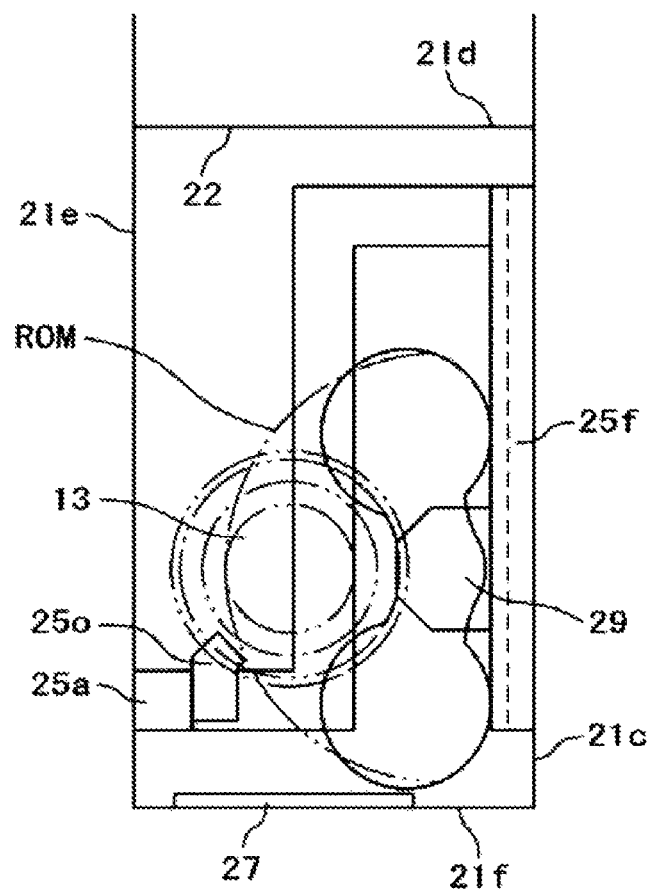
FIG. 10 is a schematic plan view of the interior of a transfer chamber of a substrate processing apparatus used in another embodiment of the present disclosure.

As shown in FIG. 10, in order to increase the throughput, a so-called two-boat apparatus (boat changer) 29 for alternately loading or unloading two boats 13 into or from the process chamber is provided in the transfer chamber 15. Even if the apparatus is provided with the boat changer 29, it is possible to install the additional ducts 25o and 25p outside the boat movable range ROM and to avoid interference with the boat 13.

Figure 11:
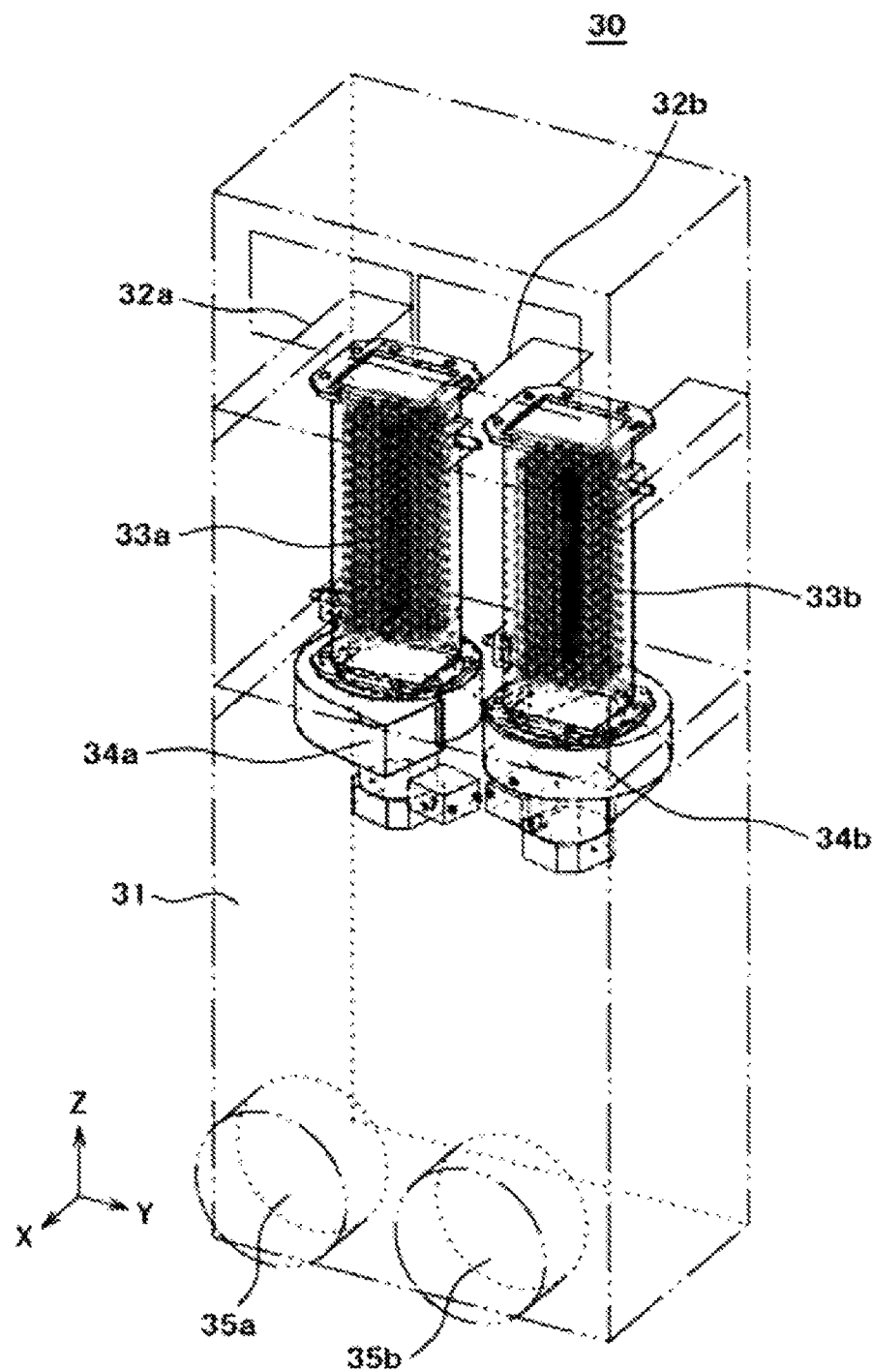
FIG. 11 is a schematic oblique perspective view of a transfer chamber door of a substrate processing apparatus used in another embodiment of the present disclosure.

As shown in FIG. 11, the transfer chamber 15 is provided with a transfer chamber door 30 on the rear side (the − direction side of the X axis) instead of the cooling wall 27. Unlike the transfer chamber door of the substrate processing apparatus shown in FIG. 3, the transfer chamber door 30 includes a duct 31 extending from the transfer chamber 15 to the outside of the transfer chamber 15, suction ports 32a and 32b extending from the transfer chamber 15, heat exchangers 33a and 33b provided in the duct 31, electric exhaust fans 34a and 34b, and discharge ports 35a and 35b.

As shown in FIG. 11, by adding the electric exhaust fans 34a and 34b to a portion which does not greatly affect the performance of the apparatus even if remodeling the transfer chamber door 30 or the like from the substrate processing apparatus shown in FIG. 2, it is possible to further promote the heat dissipation from the wafers 6 and to further improve the heat exchange efficiency.

FIG. 12 shows evaluation results obtained in a state in which 31 (thirty-one) wafers 6 are charged into the boat 13 in the form of the substrate processing apparatus shown in FIG. 2. The term "nearest radiator" refers to the heat exchangers 25i and 25j disposed in the vicinity of the suction parts 25g and 25h. The term "water cooled plate" refers to the cooling wall 27. The term "forced exhaust duct" means that a gas is exhausted to the outside of the transfer chamber 15 by the electric exhaust fans 34a and 34b of the transfer chamber door 30 shown in FIG. 11. The term "highest temperature in transfer chamber" refers to the instantaneously highest temperature in the transfer chamber 15. The atmospheric temperature is measured at a fixed point where the temperature becomes highest.

No. 00 is the normal state (in which the heat exchangers 25i and 25j are removed from the fluid circulation mechanism 25). The time to reach 80 degrees C. (cooling time) is 11 minutes and 11 seconds. The highest temperature in the transfer chamber is 97.6 degrees C.

No. 01 is a case where the cooling wall 27 is added to the normal state of No. 00. The cooling time is shortened by 36 seconds from the normal state. The highest temperature in the transfer chamber is 5.3 degrees C. lower than in the normal state.

No. 03 is a case where the nearest radiator (the heat exchangers 25i and 25j) is added to the normal state of No. 00. The cooling time is shortened by 3 minutes and 3 seconds from the normal state. The highest temperature in the transfer chamber is 9.3 degrees C. lower than in the normal state.

No. 04 is a case where the cooling wall 27 and the nearest radiator (the heat exchangers 25i and 25j) are added to the normal state of No. 00. The cooling time is shortened by 2 minutes and 54 seconds from the normal state. The highest temperature in the transfer chamber is 23.9 degrees C. lower than in the normal state. It is more preferable to use a combination of the cooling plate and the nearest radiator rather than to use one of the cooling plate or the nearest radiator.

No. 02 is a case where the forced exhaust duct is added to the normal state of No. 00. The cooling time is shortened by half of that in the normal state, but the highest temperature in the transfer chamber is 11.1 degrees C. higher than in the normal state. However, the oxygen concentration in the transfer chamber is increased by 19.8%. By bringing the edges of the wafers 6 and the ducts (suction ports 32a and 32b) of the transfer chamber door 30 closer to 140 mm, the cooling time is halved. Therefore, it is effective to merely add the additional ducts 25o and 25p to the fluid circulation mechanism 25 as shown in FIG. 8.

Figure 14:
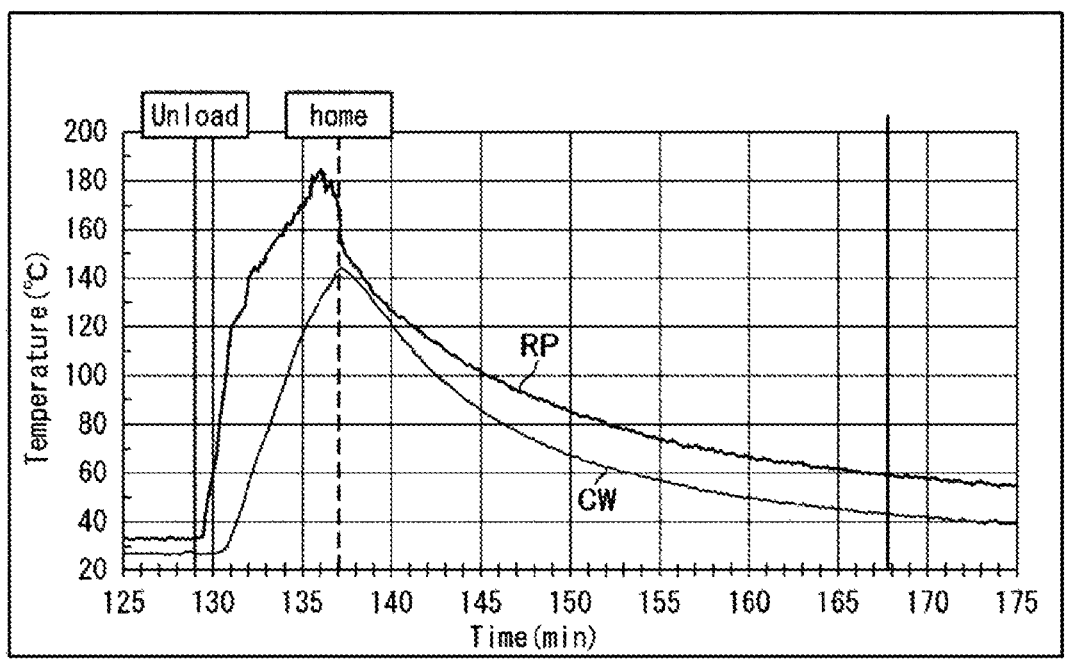
FIG. 14 is a view for explaining the effect of the cooling wall of the embodiment of the present disclosure.

FIG. 13 shows evaluation results obtained in a state in which 143 wafers 6 are charged into the boat 13 in the form of the substrate processing apparatus shown in FIG. 2. FIG. 14 shows a change in the surface temperature of the cooling wall.

No. 00 is a normal state (in which the heat exchangers 25i and 25j are removed from the fluid circulation mechanism 25). The time to reach 80 degrees C. (cooling time) is 32 minutes and 43 seconds. The highest temperature in the transfer chamber is 129.4 degrees C.

No. 01 is a case where the cooling wall 27 is added to the normal state of No. 00. The cooling time is shortened by 2 minutes and 49 seconds from the normal state. The highest temperature in the transfer chamber is 5.3 degrees C. lower than in the normal state.

As shown in FIG. 14, during the period from "Unload" to "home" (the period in which the unloading of the boat 13 from the process furnace 14 (Unload) is started and the boat 13 is returned to the home position in the transfer chamber 15), the interior of the process furnace 14 and the transfer chamber 15 are in the same space. The reflective panel surface temperature RP increases at a maximum increasing rate of 60 degrees C./min. The cooling wall surface temperature CW also increases. This indicates that the reflection panel and the cooling wall 27 are receiving the radiant heat.

The boat 13 is returned to the home position as a predetermined position in the transfer chamber 15 and the interior of the process furnace 14 and the transfer chamber 15 are isolated from each other. Thus, the temperature rise is stopped. The reflection panel surface temperature RP is higher than the cooling wall surface temperature CW and the atmosphere temperature in the transfer chamber 15. It is considered that after the interior of the process furnace 14 and the transfer chamber 15 are isolated, the reflection panel becomes a heat source that radiates heat.

Unlike the method in which the wafers 6 are cooled by blowing a cooling medium (air/$N_2$) onto the wafers 6 at a high blowing flow velocity of the cooling medium in order to increase the cooling rate, in the present embodiment, it is not necessary to increase the flow velocity of the cooling medium in order to perform cooling with the fluid circulation mechanism 25. Thus, it is not possible for the particles around the wafers to swirl upward, the wafers 6 are vibrated to generate the particles, or the temperature distribution in the transfer chamber 15 is biased to damage the control parts.

In the present embodiment, the heat leakage due to the radiation to the transfer chamber 15 can be reduced by the cooling wall 27. Therefore, even in the vertical apparatus in which a lot of time is taken to load (or unload) the wafers 6 into (or from) the interior of the process furnace 14 and in which the time during which the interior of the process furnace 14 and the transfer chamber 15 is in the same space becomes long, it is possible to reduce a bias in the temperature distribution in the transfer chamber 15.

In the present embodiment, the heat exchangers 25i and 25j are provided in the vicinity of the suction ports (suction parts) 25g and 25h. Therefore, heat moves to the duct itself (pipe) while the gas moves through the duct (flow path). It is possible to prevent the heat from diffusing into the transfer chamber 15 (including other members in the apparatus) until the gas passes through the heat exchangers 25i and 25j.

According to the present embodiment, the air supply/exhaust ports are not provided near the wafers. Therefore, it is unlikely that the maintainability of the apparatus is deteriorated and the production capacity after the operation of the apparatus is lowered. That is, after processing the wafers 6, the wafers 6 of the boat 13 can be quickly cooled down to a predetermined temperature (for example, about a room temperature). Thus, it is possible to immediately shift to the wafer discharging operation of taking out the processed wafers 6 from the boat 13 and transferring the processed wafers 6 from the boat 13 to the cassette 2.

According to the present embodiment, heat can be efficiently dissipated to the outside of the apparatus. It is therefore possible to keep temperature of the transfer chamber 15 constant. Since the temperature of the transfer chamber 15 can be kept constant, it is possible to promote heat radiation from the wafers 6 and to shorten the cooling time. In addition, since the temperature of the transfer chamber 15 can be kept constant, it is possible to reduce the risk of a growth of a natural oxide film in the transfer chamber 15. Moreover, since the risk of an occurrence of an unexpected bias in the temperature distribution of the transfer chamber 15 can be remarkably reduced, it is possible to prevent a breakage of the control member due to the heat. Furthermore, since the heat exchangers 25i, 25j and 25l are installed in the circulation ducts and the cooling wall 27 is installed in the transfer chamber door, it is possible to reduce the influence on the maintenance of the apparatus and the environment of the transfer chamber 15 (the air flow, the oxygen concentration, etc.).

The embodiments of the present disclosure have been specifically described above. However, the present disclosure is not limited to the above-described embodiments, and various modifications may be made without departing from the spirit of the present disclosure.

The present embodiment may be applied not only to a semiconductor manufacturing apparatus but also to an apparatus for processing a glass substrate such as an LCD device or the like. In the present embodiment, there has been described an example in which a film is deposited on a substrate. However, the present disclosure is not limited to such an embodiment. For example, the present disclosure may be suitably applied to a case of performing a process such as an oxidation process, a diffusion process, an annealing process or the like.

According to the present disclosure in some embodiments, it is possible to control the temperature of wafers and the temperature of an internal atmosphere of a transfer chamber.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A substrate processing apparatus, comprising:
a reaction furnace into which a substrate holder holding a plurality of substrates is loaded and unloaded from;
a preparatory chamber provided below the reaction furnace, the substrate holder being disposed at a predetermined position in the preparatory chamber;

an elevator configured to raise and lower the substrate holder between the reaction furnace and the preparatory chamber;
a fluid circulator including a plurality of suction ports configured to suck a portion of a fluid within the preparatory chamber, a pipe constituting a flow path through which the fluid flows from the plurality of suction ports to a supply duct, and a plurality of coolers provided in the flow path and configured to cool the fluid;
a cooling plate that is:
disposed on a first wall of the preparatory chamber,
the first wall being closest to a position where the substrate holder is raised or lowered among side walls of the preparatory chamber,
disposed not to face the supply duct,
configured to be capable of cooling another portion of the fluid that is not aspirated by the plurality of suction ports, after the fluid has passed through the substrate holder from the supply duct, and
configured to absorb radiant heat from the reaction furnace while the substrate holder is being raised or lowered; and
a controller configured to control the fluid circulator and the elevator so as to lower the substrate holder from the reaction furnace to the predetermined position in the preparatory chamber, circulate the fluid sucked from the plurality of suction ports through the flow path, and supply the fluid from the supply duct to the preparatory chamber,
wherein the pipe includes a vertical duct disposed in the preparatory chamber and extending in a vertical direction of the substrate holder,
wherein the plurality of suction ports are formed in the vertical duct and separately disposed in a middle portion and an upper portion of the vertical duct in the vertical direction of the substrate holder when the substrate holder is disposed at the predetermined position in the preparatory chamber, and
wherein the plurality of coolers are disposed in the vertical duct and close to the plurality of suction ports to cool the fluid introduced from the plurality of suction ports with the plurality of coolers before circulating the fluid through the flow path and to circulate the fluid cooled by the plurality of coolers through the flow path.

2. The apparatus of claim 1, wherein the plurality of suction ports are configured to locally suck the fluid in a high temperature region of the preparatory chamber.

3. The apparatus of claim 1, wherein the plurality of suction ports are disposed in the middle portion and an uppermost portion of the upper portion in the vertical direction of the substrate holder when the substrate holder is disposed at the predetermined position in the preparatory chamber.

4. The apparatus of claim 3, wherein the fluid circulator is installed such that the plurality of suction ports are adjacent to the plurality of coolers.

5. The apparatus of claim 4, wherein the plurality of coolers are installed to pass the fluid immediately after being introduced from the plurality of suction ports.

6. The apparatus of claim 5, wherein the plurality of coolers are installed to pass the fluid immediately before being introduced to the supply duct.

7. The apparatus of claim 1, further comprising a panel provided on at least one side wall of the preparatory chamber, and wherein the cooling plate is configured to reduce a temperature rise in the panel.

8. The apparatus of claim 1, further comprising a take-in part attached to each of the plurality of suction ports,
wherein the fluid circulator is configured to bring a take-in port of the take-in part close to the substrates.

9. The apparatus of claim 1, wherein the fluid supplied from the supply duct flows via the predetermined position in the preparatory chamber to the plurality of suction ports, and
wherein the cooling plate is spaced apart from a path along which the fluid flows from the supply duct to the plurality of suction ports.

10. The apparatus of claim 1, wherein a door is provided on the first wall of the preparatory chamber to which the cooling plate is disposed adjacent.

11. The apparatus of claim 1, wherein a material of the cooling plate has high heat conductivity.

12. The apparatus of claim 1, wherein a material of the cooling plate is metal.

13. The apparatus of claim 1, wherein a surface of the cooling plate is processed with black alumite.

14. The apparatus of claim 1, wherein the fluid circulator is configured to be installed outside a movable range of the substrate holder.

15. The apparatus of claim 1, wherein the fluid circulator is installed to pass the fluid through the plurality of coolers, which are disposed at least at a position immediately after the plurality of suction ports and at a position immediately before the supply duct.

16. The apparatus of claim 1, wherein the fluid circulator is installed to pass the fluid introduced from the plurality of suction ports through the plurality of coolers a plurality of number of times.

17. A non-transitory computer-readable recording medium storing a program executed in a computer controlling a substrate processing apparatus comprising:
a reaction furnace into which a substrate holder holding a plurality of substrates is loaded and unloaded from;
a preparatory chamber provided below the reaction furnace, the substrate holder being disposed at a predetermined position in the preparatory chamber;
an elevator configured to raise and lower the substrate holder between the reaction furnace and the preparatory chamber;
a fluid circulator including a plurality of suction ports configured to suck a portion of a fluid within the preparatory chamber, a pipe constituting a flow path through which the fluid flows from the plurality of suction ports to a supply duct, and a plurality of coolers provided in the flow path and configured to cool the fluid; and
a cooling plate that is:
disposed on a first wall of the preparatory chamber,
the first wall being closest to a position where the substrate holder is raised or lowered among side walls of the preparatory chamber,
disposed not to face the supply duct,
configured to be capable of cooling another portion of the fluid that is not aspirated by the plurality of suction ports, after the fluid has passed through the substrate holder from the supply duct, and
configured to absorb radiant heat from the reaction furnace while the substrate holder is being raised or lowered,
wherein the pipe includes a vertical duct disposed in the preparatory chamber and extending in a vertical direction of the substrate holder, wherein the plurality of suction ports are formed in the vertical duct and separately disposed in a middle portion and an upper portion of the vertical duct in the vertical direction of the substrate holder when the substrate holder is disposed at the predetermined position in the preparatory chamber, and wherein the program causes, by the computer, the substrate processing apparatus to perform:
  processing the substrates held by the substrate holder;
  lowering the substrate holder from the reaction furnace to the predetermined position in the preparatory chamber;
  sucking the fluid within the preparatory chamber from the plurality of suction ports into the flow path; and
  cooling the fluid with the plurality of coolers disposed in the vertical duct and close to the plurality of suction ports before the fluid introduced from the plurality of suction ports is circulated through the flow path, circulating the cooled fluid through the flow path, and discharging the fluid from the supply duct to the preparatory chamber.

* * * * *